(12) United States Patent
Takada

(10) Patent No.: US 6,727,767 B2
(45) Date of Patent: Apr. 27, 2004

(54) VOLTAGE CONTROLLED OSCILLATOR WITH TWO LAYERED MOUNTING STRUCTURE

(76) Inventor: Yutaka Takada, c/o Seiko Epson Corporation 3-5, Owa 3-chome, Suwa-shi, Nagano-ken 392-8502 (JP)

(*) Notice: Subject to any disclaimer, the term of this patent is extended or adjusted under 35 U.S.C. 154(b) by 0 days.

(21) Appl. No.: 10/238,988

(22) Filed: Sep. 10, 2002

(65) Prior Publication Data

US 2003/0067360 A1 Apr. 10, 2003

(30) Foreign Application Priority Data

Sep. 28, 2001 (JP) ........................................ 2001-304137

(51) Int. Cl.⁷ ................................................ H03B 5/32
(52) U.S. Cl. .............................. 331/107 A; 331/108 C; 331/107 SL; 331/135; 359/331; 359/332; 310/322; 310/313 R; 333/154; 333/150; 361/794; 361/795; 361/810; 385/7
(58) Field of Search ..................... 331/107 A, 108 C, 331/107 SL, 135; 359/331, 332; 310/322, 313 R; 361/794, 795, 810; 385/7

(56) References Cited

U.S. PATENT DOCUMENTS

| | | | |
|---|---|---|---|
| 3,568,000 A | | 3/1971 | D'Aboville et al. |
| 4,325,032 A | * | 4/1982 | Gilden ........................ 331/25 |
| 4,560,951 A | * | 12/1985 | Futterer ................... 331/107 A |
| 4,871,984 A | | 10/1989 | Laton et al. ............ 331/107 A |
| 5,039,957 A | | 8/1991 | Greer et al. ............ 331/107 A |
| 5,874,866 A | * | 2/1999 | Satoh et al. ............ 331/107 A |

FOREIGN PATENT DOCUMENTS

| JP | 46-34642 | 10/1971 |
|---|---|---|
| JP | 59144206 | 8/1984 |
| JP | 4-65905 | 3/1992 |
| JP | 5-48417 | 6/1993 |
| JP | 2000-151276 | 5/2000 |
| JP | 2001-127547 | 5/2001 |
| JP | 2001-160713 | 6/2001 |

OTHER PUBLICATIONS

Montress, G.K. et al, "Design and Performance of a Low Noise, Wide Tuning Range AQP SAW Delay Line VCO", Proceedings of the Frequency Control Symposium, May 27–29, 1992 New York, IEEE, pp. 356–370.

Kurisu, M. et al., "Design Innovations for Multi–Gigahertz–Rate Communications Circuits with Deep–Submicron CMOS Technology" IEICE Transations on Electronics, Institute of Electronics Information and Comm. Eng. Tokyo, JP, vol. E82–C, No. 3, Mar. 1999, pp. 428–437.

European Search Report from corresponding EP Application No. 02019793.5. Nov. 8, 2002.

Avramov, ID et al, "High–Performance Surface Transverse Wave Based Voltage Controlled Feedback Oscillators in the 2.0 to 2.5 GHz Range", Frequency Control Symposium, 1998, Proceedings of the 1998 IEEE Int'l Pasadena, Ca, May 27–29, 1998, pp. 519–527.

* cited by examiner

*Primary Examiner*—Arnold Kinkead
(74) *Attorney, Agent, or Firm*—Harness, Dickey & Pierce, P.L.C.

(57) ABSTRACT

A voltage controlled oscillator is provided. The oscillator includes a surface acoustic wave element for forming a feedback circuit for an amplifier, and a phase adjustment circuit including a filter which is interposed in the feedback circuit. The oscillator also has a phase shifter including a hybrid coupler to which an additional control part is attached for changing a phase value within an oscillation loop with a control voltage supplied from an external source. An equal power divider equally distributes output power within the oscillation loop and supplies the output power outside the oscillation loop. A multi-layer board is used for mounting the amplifier, surface acoustic wave element, phase adjustment circuit, phase shifter, and equal power divider in at least two separate layers.

12 Claims, 8 Drawing Sheets

VOLTAGE CONTROLLED OSCILLATOR WITH TWO LAYERED MOUNTING STRUCTURE

BACKGROUND OF THE INVENTION

1. Technical Field

The present invention relates to a voltage controlled oscillator, a receiver, and a communication device. In particular, the present invention is preferably applied to a voltage controlled oscillator in which a surface acoustic wave element is used as a resonator to form a feedback circuit.

2. Prior Art

Conventional high frequency oscillators include voltage controlled oscillators in which micro strip lines and strip lines are used as a resonator. Unlike a surface acoustic wave element that uses the piezoelectric effect of a quartz crystal substrate, the voltage controlled oscillator using such a resonator can not expect to have a large Q value.

On the other hand, the voltage controlled oscillator using a surface acoustic wave element as a resonator is able to have highly stable and high quality properties and, thus, it may be used as a reference oscillator for communication networks with a transmission rate of several gigabits/s or more. This type of voltage controlled oscillator is described, for instance, in Japan Laid-Open Patent Application 59-158106.

FIG. 11 is a block diagram showing an exemplary structure of the prior art voltage controlled oscillator. A surface acoustic wave element 201 and a 3 dB–90° coupler having an additional control part for changing the phase value within the oscillation loop with control voltage Vc supplied from an external source are interposed in series to form the feedback circuit of an amplifier 202 for oscillation. Here, the control voltage Vc is supplied to the 3 dB–90° coupler 203 to change the phase value within the oscillation loop and, thus, to change the oscillation frequency.

A voltage controlled oscillator having an output power divider besides the structure in FIG. 11 is described in the journal of IEEE International Frequency Control Symposium, pp519–527, 1998.

FIG. 12 is a block diagram to show the structure of this prior art voltage controlled oscillator.

FIG. 12 shows a surface acoustic wave element 301, a variable phase shifter 302 for changing the phase value within the oscillation loop with control voltage supplied from an external source, an amplifier 303, an equal power divider 304 for equally distributing the output from the oscillation loop and supplying it outside, and a loop adjustment line 305. The surface acoustic wave element 301, variable phase shifter 302, equal power divider 304, and loop adjustment line 305 are interposed in series to form a feedback loop on the output and input sides of the amplifier 303.

The loop adjustment line 305 is provided with a transmission line formed by a microstrip line. With fine adjustment of the line length, frequency regulation can be executed to make the phase angle zero after one round of the feedback loop.

However, the prior art voltage controlled oscillators described above have many structural elements and, therefore, require a proportionally large number of parts. This can cause problems in reliability and increased cost. In particular, the voltage controlled oscillator in FIG. 12 requires many parts and a large mounting surface area for the variable phase shifter 302 and equal power divider 304.

For the voltage controlled oscillator with an output frequency of several hundred MHz, the variable phase shifter 302 and equal power divider 304 can consist of a lumped constant circuit, which allows a reduction in the size of the entire circuit, but requires many parts. For a voltage controlled oscillator with an output frequency of several GHz, the variable phase shifter 302 and equal power divider 304 can consist of a transmission line designed with distributed constants, which allows a reduced number of parts, but requires large mounting surfaces due to the length and size of the transmission line.

One purpose of the present invention is to provide a voltage controlled oscillator, a receiver, and a communication device, which have a reduced mounting area for downsizing while satisfying the basic properties.

SUMMARY OF THE INVENTION

To solve the problems described above, the voltage controlled oscillator, according to one embodiment of the invention, is characterized by comprising an amplifier; a surface acoustic wave element for forming a feedback circuit for the amplifier; a phase adjustment circuit consisting of a filter and interposed in the feedback circuit; a phase shifter consisting of a hybrid coupler to which an additional control part is attached for changing the phase value within the oscillation loop with control voltage supplied from an external source; an equal power divider for equally distributing output power within the oscillation loop and supplying it outside the oscillation loop; and a multi-layer board for mounting the amplifier, surface acoustic wave element, phase adjustment circuit, phase shifter, and equal power divider in at least two separate layers.

This prevents extension of the mounting area and allows a larger variable range of frequencies for the voltage controlled oscillator while obtaining excellent frequency properties for the control voltage.

The mounting area can be reduced for downsizing the voltage controlled oscillator in both forms of a lumped constant circuit and a distributed constant circuit.

Furthermore, a low insertion loss and low return loss are realized, which allows for minimized circuit loss and reduced output fluctuation, thus ensuring stable circuit operation for the load.

The voltage controlled oscillator, according to another embodiment the invention, is characterized by the multi-layer board and is provided with a microstrip line structure consisting of a first wiring layer and a second wiring layer, and a strip line structure consisting of the second wiring layer, a third wiring layer, and a fourth wiring layer.

This allows stacking of the strip line and microstrip line structures for the purpose of downsizing as well as allowing a via connection between the strip line and microstrip line structures, which ensures efficient circuit geometry. A distributed constant circuit, which requires a large horizontal mounting area, can be stacked vertically for the purpose of downsizing, thereby significantly reducing the mounting area.

The underlying strip line structure contributes to more ground layers and improved mechanical strength of the circuit board. The circuit board can be connected to and mounted on a main board through the ground layers. The voltage controlled oscillator according to another embodiment of the invention is characterized by the second and fourth wiring layers having a ground layer.

This allows the strip line structure to share the ground layer with the microstrip line structure. A wiring layer can be added to the strip line structure to stack the microstrip line structure on the strip line structure. This prevents an increase in the number of wiring layers and enables the provision of the microstrip line and strip line structures on the same board.

The voltage controlled oscillator according to another embodiment of the invention is characterized by the amplifier, surface acoustic wave element, additional control part, and phase adjustment circuit being provided on the micro strip line structure; and the hybrid coupler and equal power divider being provided on the strip line structure. This allows surface mounting of parts that can not be built in the board, such as a surface acoustic wave element for the voltage controlled oscillator in the form of a distributed constant circuit as well as realizes a multi-layered transmission line, which occupies a large area. The voltage controlled oscillator can satisfy the basic properties while being downsized.

The voltage controlled oscillator according to another embodiment of the invention is characterized by the hybrid coupler and equal power divider provided on the strip line structure having a transmission line which is rectangularly bent.

This prevents a horizontal extension of the transmission line that is provided on the strip line structure, realizing a downsized voltage controlled oscillator.

The voltage controlled oscillator according to another embodiment of the invention is characterized by engaging the convex rectangular bends in the concave rectangular bends. This allows for efficient usage of the board area by simply changing the transmission line pattern. The mounting board can be downsized even if the transmission line is horizontally disposed in the board.

The voltage controlled oscillator according to another embodiment of the invention is characterized by the multi-layer board and is provided with a micro strip line structure consisting of a first wiring layer and a second wiring layer; a strip line structure consisting of the second wiring layer, a third wiring layer, and a fourth wiring layer; and a micro strip line structure consisting of the fourth wiring layer and a fifth wiring layer.

This allows stacking of a microstrip line structure above and below the strip line structure by adding the fifth wiring layer. This also allows a via connection between the strip line and microstrip line structures for efficient circuit geometry, enlarging the mounting surface area while preventing the increase in size of the circuit board.

The voltage controlled oscillator according to another embodiment of the invention is characterized by the second and fourth wiring layers having a ground layer. This allows the sharing of the ground layers above and below the center strip line structure with the micro strip line structures provided above and below them.

A microstrip line structure can be stacked one each above and below the strip line structure by adding a wiring layer one each above and below the strip line structure. This realizes two layers of microstrip line structures and one layer of strip line structure on the same board while preventing the increase in number of the wiring layers.

The voltage controlled oscillator according to another embodiment of the invention is characterized by the multi-layer board and is provided with a micro strip line structure consisting of a first wiring layer and a second wiring layer; a strip line structure consisting of the second wiring layer, a third wiring layer, and a fourth wiring layer; and a strip line structure consisting of the fourth wiring layer, a fifth wiring layer, and a sixth wiring layer.

This allows the stacking of microstrip line and strip line structures above and below the strip line structure, respectively, using only six wiring layers. The strip line and microstrip line structures can be via connected for efficient circuit geometry. This prevents the increase in the mounting area and realizes a downsized circuit board even for a large scale voltage controlled oscillator in the form of a distributed constant circuit.

The voltage controlled oscillator according to another embodiment of the invention is characterized by the second, fourth, and sixth wiring layers having a ground layer. This allows the sharing of the ground layers above and below the center strip line structure with the micro strip line and strip line structures provided above and below them.

A microstrip line structure and a strip line structure can be stacked above and below the strip line structure, respectively, by adding a wiring layer above the strip line structure and two wiring layers below the strip line structure. The receiver according to the invention comprises a photodiode for converting optical signals into electric signals; a clock data recovery for extracting data and synchronous signals from the electric signals; a voltage controlled oscillator for providing signals to operate the clock data recovery; a deserializer for converting serial data that are extracted by the clock data recovery into parallel data; and a decoder for decoding the parallel data, characterized by the voltage controlled oscillator comprising an amplifier; a surface acoustic wave element for forming a feedback circuit for the amplifier; a phase adjustment circuit consisting of a filter and interposed in the feedback circuit; a phase shifter consisting of a hybrid coupler to which an additional control part is attached for changing the phase value within the oscillation loop with control voltage supplied from an external source; an equal power divider for equally distributing output power within the oscillation loop and supplying it outside the oscillation loop; and a multi-layer board for mounting the amplifier, surface acoustic wave element, phase adjustment circuit, phase shifter, and equal power divider in at least two separate layers.

This enables data processing with data transmission rates of several gigabits/second to several tens of gigabits/second while preventing an increase in the mounting area. This also minimizes circuit loss and output fluctuations and realizes a stable receiving operation for the load. The communication device according to the invention comprises an access control part for controlling data access; an oscillator for generating synchronous clocks; a PLL control part for controlling frequencies based on the outputs from the oscillator; an encoder for combining and encoding parallel data from the access control part and the synchronous clocks; a serializer for converting the parallel data combined with the synchronous clocks into serial data; a laser diode for converting the serial data into optical signals; a photodiode for converting the optical signals into electric signals; a clock data recovery for extracting the data and synchronous signals from the electric signals; a voltage controlled oscillator for providing signals to operate the clock data recovery; a deserializer for converting serial data that are extracted by the clock data recovery into parallel data; and a decoder for decoding and supplying the parallel data to the access control part, characterized by the voltage controlled oscillator comprising an amplifier; a surface acoustic wave element for forming a feedback circuit for the amplifier; a phase adjustment circuit consisting of a filter and interposed in the feedback circuit; a phase shifter consisting of a hybrid coupler to which an additional control part is attached for changing the phase value within the oscillation loop with control voltage supplied from an external source; an equal power divider for equally distributing output power within the oscillation loop and supplying it outside the oscillation loop; and a multi-layer board for mounting the amplifier, surface acoustic wave element, phase adjustment circuit, phase shifter, and qui-distributor in at least two separate layers.

This enables gigabits network systems that ensure stable circuit operation for the load while preventing an increase in the mounting area.

DETAILED DESCRIPTION OF THE PREFERRED EMBODIMENTS

Figure 1:
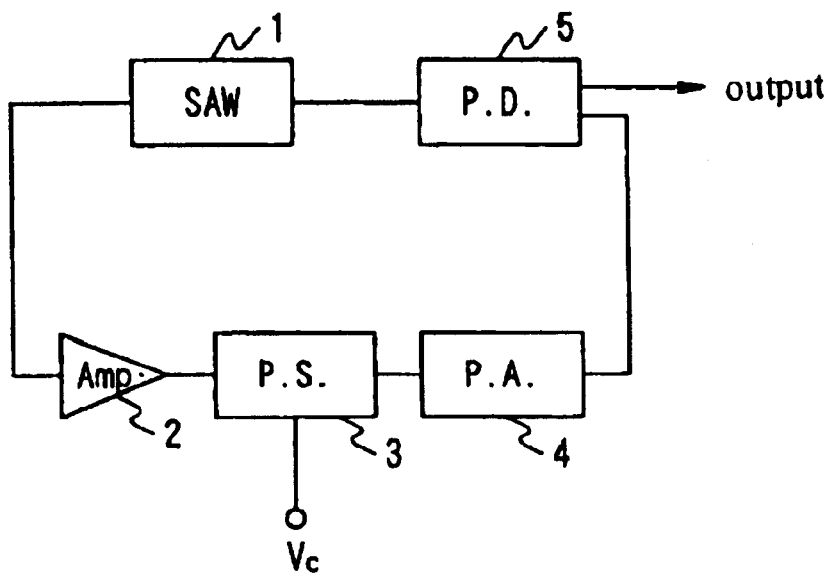
FIG. 1 is a block diagram to show the structure of the voltage controlled oscillator of Embodiment 1 of the present invention.

Embodiments of the voltage controlled oscillator of the present invention are hereinafter described with reference to the drawings. FIG. 1 is a block diagram to show the structure of the voltage controlled oscillator of Embodiment 1 of the present invention.

In FIG. 1, a surface acoustic wave element 1, a phase shifter 3 for changing the phase value within the oscillation loop with control voltage Vc supplied from an external source, a phase adjustment circuit 4 for fine adjustment of the phase within the oscillation loop, an equal power divider 5 for equally distributing output power within the oscillation loop and supplying it outside the oscillation loop are interposed in series to form a the feedback loop on the output and input sides of an amplifier 2 for oscillation. The blocks are all coupled to each other with a certain matching characteristic impedance of, for instance, 50 Ω.

Figure 2:
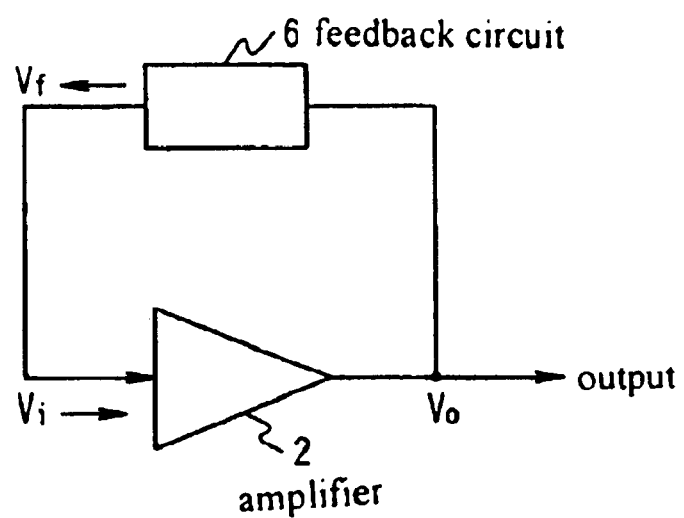
FIG. 2 is a block diagram to show the structure of the feedback type oscillator of an embodiment of the present invention.

FIG. 2 is a block diagram to show the structure of a feedback type oscillator of an embodiment of the present invention. Here, the operation of the voltage controlled oscillator in FIG. 1 is described in which the feedback circuit 6 consists of the surface acoustic wave element 1, phase shifter 3, phase adjustment circuit 4, and equal power divider 5. In FIG. 2, the voltage controlled oscillator in FIG. 1 can be considered to be a feedback type oscillator in which the feedback circuit 6 is connected to the amplifier 2.

When an input voltage Vi appears on the input side of the amplifier 2 having a amplification factor G, an output voltage Vo that results from multiplying Vi by G appears on the output side. The output voltage Vo passes through the feedback circuit 6 having a feedback factor β, and a feedback voltage Vf (Vf=Vo·β=Vi·G·β) returns to the input. If the feedback voltage Vf and the input voltage Vi are in phase and the feedback voltage Vf is larger than the input voltage Vi, the positive feedback exhibits oscillation.

The following expression (1) should be satisfied for an oscillation in which the input voltage Vi has a phase $\theta_i$, the feedback voltage Vf has a phase $\theta_f$, the amplifier 2 gives a phase shift $\theta_G$, and the feedback circuit gives a phase shift $\theta_\beta$:

i. $V_i \cdot G \cdot \beta \cdot e^{j(\theta i+\theta G+\theta \beta)} >= V_i \cdot e^{j(2\pi+\theta i)}$     (1)

In the expression (1), the input voltage Vi should be in phase with itself as initially input when it is fed back to the input after passing through the amplifier 2 and the feedback circuit 6. Thus, the following expressions (2) and (3) should be satisfied:

i. $\theta_G+\theta_\beta=2n\pi (n=0,1,2,\ldots)$     (2)

ii. $G \cdot B > 1$     (3)

The expressions (2) and (3) define the phase and amplitude conditions of the oscillator, respectively. In practice, when the feedback voltage Vf increases high enough to saturate the output voltage Vo of the amplifier, it reaches a steady state in which G·β=1. With the voltage controlled oscillator in FIG. 1, the phase shifter 3 can be used to change the phase value θβ of the feedback circuit 6 so as to change the oscillation frequency.

The phase shifter 3 can consist of a −3 dB90° hybrid coupler and a variable reactance circuit accompanying it. This allows large phase changes with low insertion loss and low return loss.

Consequently, the voltage controlled oscillator can have a large variable range of frequencies and excellent frequency variable properties for the control voltage Vc. It can be used as a reference oscillator for communication network systems with a transmission rate over several gigabits/second.

Low insertion loss and low return loss lead to minimized circuit loss. Therefore, an efficient voltage controlled oscillator with reduced output fluctuations can be obtained. Furthermore, the equal power divider 5 equally distributes output power and supplies it outside the oscillation loop without interference with impedance within the oscillation loop. Therefore, a stable circuit operation is ensured for the load.

The surface acoustic wave element 1, amplifier 2, phase shifter 3, phase adjustment circuit 4, and equal power divider 5 are disposed in multiple layers. The voltage controlled oscillator can still be downsized even though the phase shifter 3 and equal power divider 5 are provided, which require many parts and a large mounting area. When the voltage controlled oscillator has an output frequency of several hundred MHz and the phase shifter 3 and equal power divider 5 consist of lumped constant circuits, the entire circuit size can be small in spite of having a large number of parts.

Figure 3:
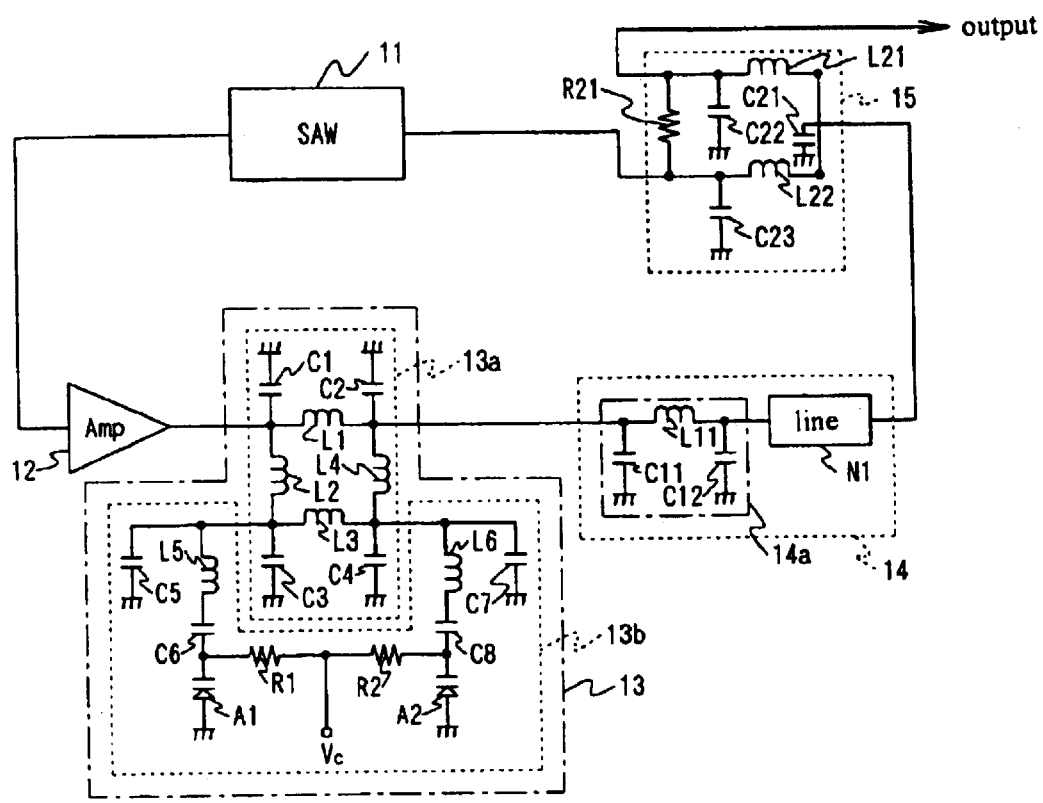
FIG. 3 is a block diagram to show the structure of the voltage controlled oscillator of Embodiment 2 of the present invention.

When the voltage controlled oscillator has an output frequency of several GHz and the phase shifter 3 and equal power divider 5 consist of distributed constant circuits, the length and size of the transmission line hardly increases its mounting area and, therefore, the mounting board can remain small. FIG. 3 is a block diagram to show the structure of the voltage controlled oscillator of Embodiment 2 of the present invention. Embodiment 2 uses a lumped constant circuit for the voltage controlled oscillator in FIG. 1.

In FIG. 3, a surface acoustic wave element 11, a phase shifter 13, a phase adjustment circuit 14, and an equal power divider 15 are interposed in series to form a feedback loop on the output and input sides of an amplifier 12 for oscillation. The blocks are all coupled to each other with a certain matching characteristic impedance of, for instance, 50 Ω. Here, the phase shifter 13 changes the phase value within the oscillation loop using the control voltage Vc supplied from an external source and is provided with −3 dB90°□hybrid coupler 13a and an additional control part 13b.

The −3 dB90° hybrid coupler 13a is provided with capacitors C1–C4 and coils L1–L4.

The coils L1–L4 are connected in a loop. The capacitor C1 is connected between the coils L1 and L2 and the output of the amplifier 12 is also connected there. The capacitor C3 is connected between the coils L2 and L3. The capacitor C4 is connected between the coils L3 and l4. The capacitor C2 is connected between the coils L4 and L1 and so is the input of the phase adjustment circuit 14.

The additional control part 13b consists of a variable reactance circuit and is provided with capacitors C5–C8, coils L5, L6, resistors R1, R2, and variable capacitors A1, A2. The capacitor C5, coil L5, capacitor C6, resistor R1, resistor R2, capacitor C8, coil L6, and capacitor C7 are connected in series and in this sequence. The terminal between the capacitor C5 and the coil L5 is connected to the terminal between the capacitor C3 and coil L2 of the −3 dB90° hybrid coupler 13a. The terminal between the capacitor C7 and the coil L6 is connected to the terminal between the capacitor C4 and coil L4 of the −3 dB90° hybrid coupler 13a.

The variable capacitor A1 is connected between the capacitor C6 and the resistor R1 and the variable capacitor A2 is connected between the capacitor C8 and the resistor R2. The input terminal for control voltage Vc is provided between the resistors R1 and R2. The phase adjustment circuit 14 performs fine adjustment of the phase within the oscillation loop and is provided with a line N1 and a low pass filter 14a.

The low pass filter 14a is provided with capacitors C11, C12 and a coil L11. The capacitors C11 and Cl2 are connected to either side of the coil L11, respectively. The terminal between the capacitor C11 and the coil L11 is connected to the terminal between the capacitor C2 and coil L4 of the −3 dB90° hybrid coupler 13a. The terminal between the capacitor C12 and the coil L11 is connected to the line N1.

The equal power divider 15 equally distributes output power within the oscillation loop, supplies it outside the oscillation loop and is provided with capacitors C21 C23, coils L21, L22, and a resistor R21. The capacitor C22, coil L21, coil L22, and capacitor C23 are connected in series and in this sequence. The capacitor C21 is connected between the coils L21 and L22 and so is the line N1. The output of the voltage controlled oscillator is connected between the capacitor C22 and the coil L21. The input of the surface acoustic wave element 11 is connected between the capacitor C23 and the coil L22. The resistor R21 is connected between the output of the voltage controlled oscillator and the input of the surface acoustic wave element 11.

With the voltage controlled oscillator in the form of a lumped parameter circuit, Embodiment 2 described above includes many parts. However, these parts are disposed in multiple layers for increased integration of the mounting parts, therefore downsizing the entire circuit (the entire circuit board size depends on the number and sizes of parts used).

With the voltage controlled oscillator in the form of a lumped constant circuit, passive parts start to exhibit self-resonance around 1 GHz band. Therefore, this is not suitable for oscillators above the self-resonance frequency. Divergence in individual parts has significant influence on electric properties. Larger parts numbers are disadvantageous to reliability.

Figure 4:
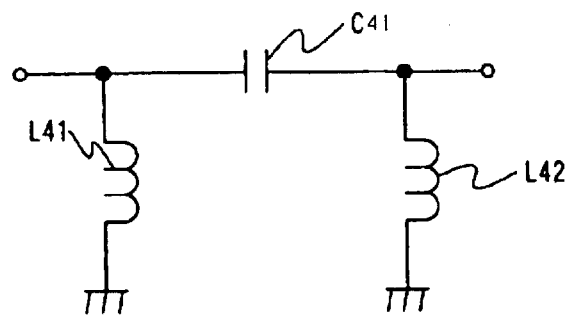
FIG. 4 is a circuit diagram to show another structure of the phase adjustment circuit of an embodiment of the present invention.

FIG. 4 is a circuit diagram to show another structure of the phase adjustment circuit of an embodiment of the present invention. A capacitor C41 and coils L41, L42 are shown In FIG. 4. The coils L41 and L42 are connected to either side of the capacitor C41, respectively. The circuit in FIG. 4 can be used to form a phase adjustment circuit in place of the low pass filter 14a in FIG. 3.

Figure 5:
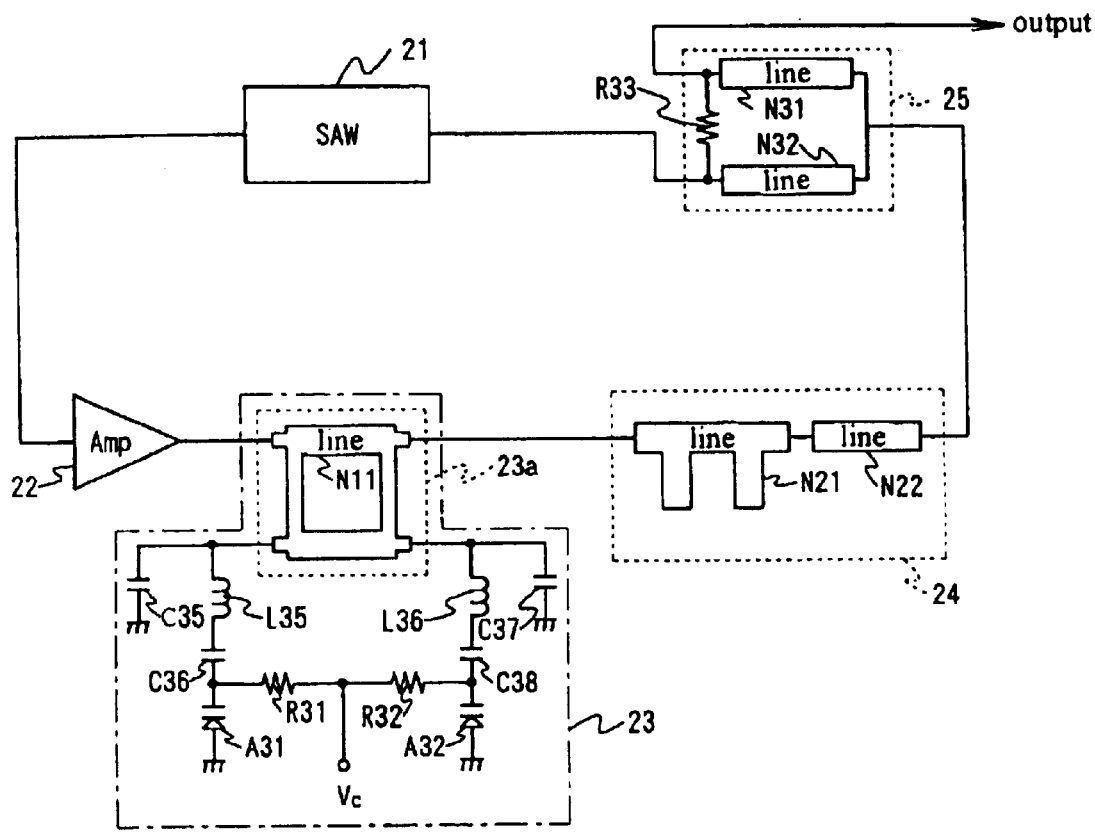
FIG. 5 is a block diagram to show the structure of the voltage controlled oscillator of Embodiment 3 of the present invention.

Such a phase adjustment circuit can be a distributed constant circuit. FIG. 5 is a block diagram to show the structure of the voltage controlled oscillator of Embodiment 3 of the present invention. Embodiment 3 is an embodiment of the voltage controlled oscillator in FIG. 1 in the form of a distributed constant circuit. In FIG. 5, a surface acoustic wave element 21, a phase shifter 23, a phase adjustment circuit 24, and an equal power divider 25 are interposed in series to form a feedback loop on the output and input sides of an amplifier 22 for oscillation. The blocks are all coupled to each other with a certain matching characteristic impedance of, for instance, 50 Ω.

Here, the phase shifter 23 is provided with −3 dB90° hybrid coupler 23a and an additional control part. The −3 dB90° hybrid coupler 23a in FIG. 5 consists of a line N11 while the −3 dB90° hybrid coupler 13a in FIG. 3 consists of the capacitors C1–C4 and coils L1–L4. The line N11 connected in loop and has four terminals extended from it.

The first terminal of the line N11 is connected to the output terminal of the amplifier 22. The second terminal of the line N11 is connected to the input of the phase adjustment circuit 24. The third terminal of the line N11 is connected to the terminal between the capacitor C35 and coil L35 of the additional control part. The fourth terminal of the line N11 is connected to the terminal between the capacitor C37 and coil L36 of the additional control part.

The additional control part consists of a variable reactance circuit and is provided with capacitors C35–C38, coils L35, L36, resistors R31, R32, and variable capacitors A31, A32 as is in the structure in FIG. 3. The capacitor C35, coil L35, capacitor C36, resistor R31, resistor R32, capacitor C38, coil L36, and capacitor 37 are connected in this sequence. The terminal between the capacitor C35 and coil L35 is connected the =3 dB90° hybrid coupler 23a. The terminal between the capacitor C37 and the coil L36 is connected to the −3 dB90° hybrid coupler 23a.

The variable capacitor A31 is connected between the capacitor C36 and the resistor R31 and the variable capacitor A32 is connected between the capacitor C38 and the resistor R32. The input terminal for control voltage Vc is provided between the resistors R31 and R32. The phase adjustment circuit 24 is provided with lines N21, N22. The line N21 serves as a low pass filter in the phase adjustment circuit 24 of FIG. 5 while the capacitors C11, C12 and coil L11 form a low pass filter 14a in the phase adjustment circuit 14 of FIG. 3

The equal power divider 25 is provided with lines N31, N32 and a resistor R33. The equal power divider 15 in FIG. 3 is provided with the capacitors C21–C23, coils L21, L22, and resistor R21 and is in the form of a lumped constant circuit. Here, in place of these elements, the equal power divider 25 in FIG. 5 uses the lines N31, N32 to form a distributed constant circuit.

Embodiment 3 described above illustrates the voltage controlled oscillator in the form of a distributed constant circuit. This allows a 50% reduction in the total number of parts mounted on the board. For instance, the phase shifter 13 of FIG. 3 requires 18 parts. However, the parts number is reduced to 10 in the phase shifter 23 of FIG. 5.

The equal power divider 15 in FIG. 3 requires 6 parts while the equal power divider 25 in FIG. 5 requires 1 part. Reduced numbers of parts require less assembly time circuit, the arrangement in which the line N11 of the −3 dB90° hybrid coupler 23a and the lines N31, N32 of the equal power divider 25, which occupy a large area, are termed by the third wiring layer H3. The surface acoustic element 21, amplifier 22, and chip element P, which cannot be built in the board, are formed on the first wiring layer H1, preventing the horizontal extension of the lines N11, N31, and N32 on the first wiring layer H1, and leading to the downsizing of the voltage controlled oscillator.

Figure 6:
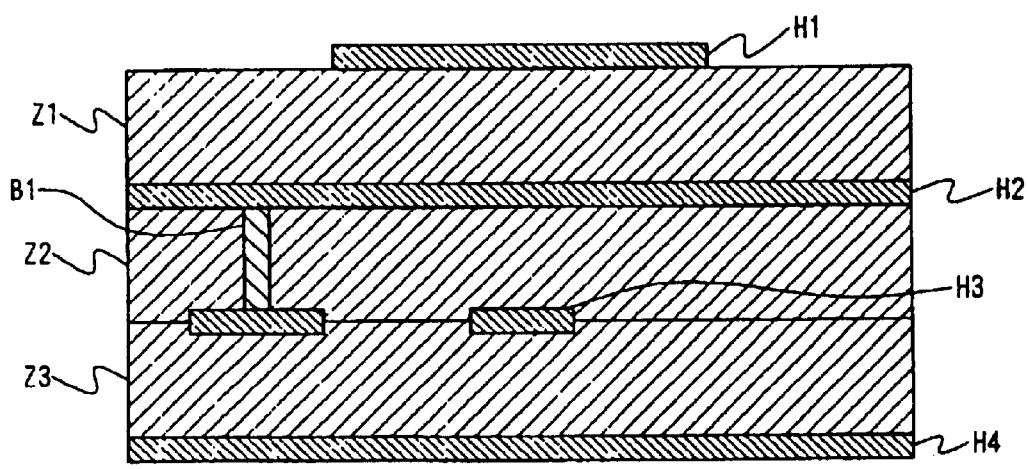
FIG. 6 is a section view to schematically show the structure of the voltage controlled oscillator of Embodiment 4 of the present invention.

FIG. 6 is a section view to schematically show the structure of the voltage controlled oscillator of Embodiment 4 of the present invention. In FIG. 6, the voltage controlled oscillator in FIG. 5 is mounted on a four-layer wiring board. The four-layer wiring board includes a first wiring layer H1, a second wiring layer H2, a third wiring layer H3, and a fourth wiring layer H4 as well as insulating layers Z1–Z3 in-between. The wiring layers H1–H4 are connected by way of a via B1 if necessary.

Here, the second and fourth wiring layers H2 and H4 are provided with a ground layer. The first and second wiring layers H1 and H2 form a microstrip line structure. The second, third, and fourth wiring layers H2, H3, and H4 form a strip line structure. Thus, the transmission line circuit consisting of a distributed constant structure that requires a substantial mounting area is formed on the lower layers with the strip line. Other mounting parts including chips that cannot be built in the board are formed on the upper layer with the microstrip line structure. Then, the transmission lines on the lower and upper layers are connected by way of the via B1.

The arrangement in which the lower layer of the multiple layer board has the strip line structure and the upper layer has the microstrip line structure, and the strip line and microstrip line structures are connected by way of the via BI allows the downsizing of a distributed constant circuit, which otherwise requires a horizontally large mounting area. In practice, the mounting area can be reduced by one eighth compared to the voltage controlled oscillator having only the microstrip line structure on both sides of a board. The microstrip line structure on both sides of a board requires, for instance, a mounting area of 18×48=864 mm². On the contrary, the four-layer board including the microstrip line and strip line structures in FIG. 6 requires only 10×10=100 mm².

The size of the voltage controlled oscillator is primarily determined by the size of the strip line provided on the third wiring layer H3. Therefore, the third wiring layer H3 can be downsized to control the entire size of the voltage controlled oscillator. The strip line structure underlies the microstrip line structure. This contributes to increased ground layers and enhanced mechanical strength of the circuit board.

The insulating layers Z1–Z3 of the multi-layer board can be made of dielectric materials such as glass epoxy resin, Teflon (registered trademark) resin, and alumina ceramics. The multi-layer board can have different dielectric constants in the respective layers. Microstrip line structures can be on both sides of the strip line structure.

Figure 7:
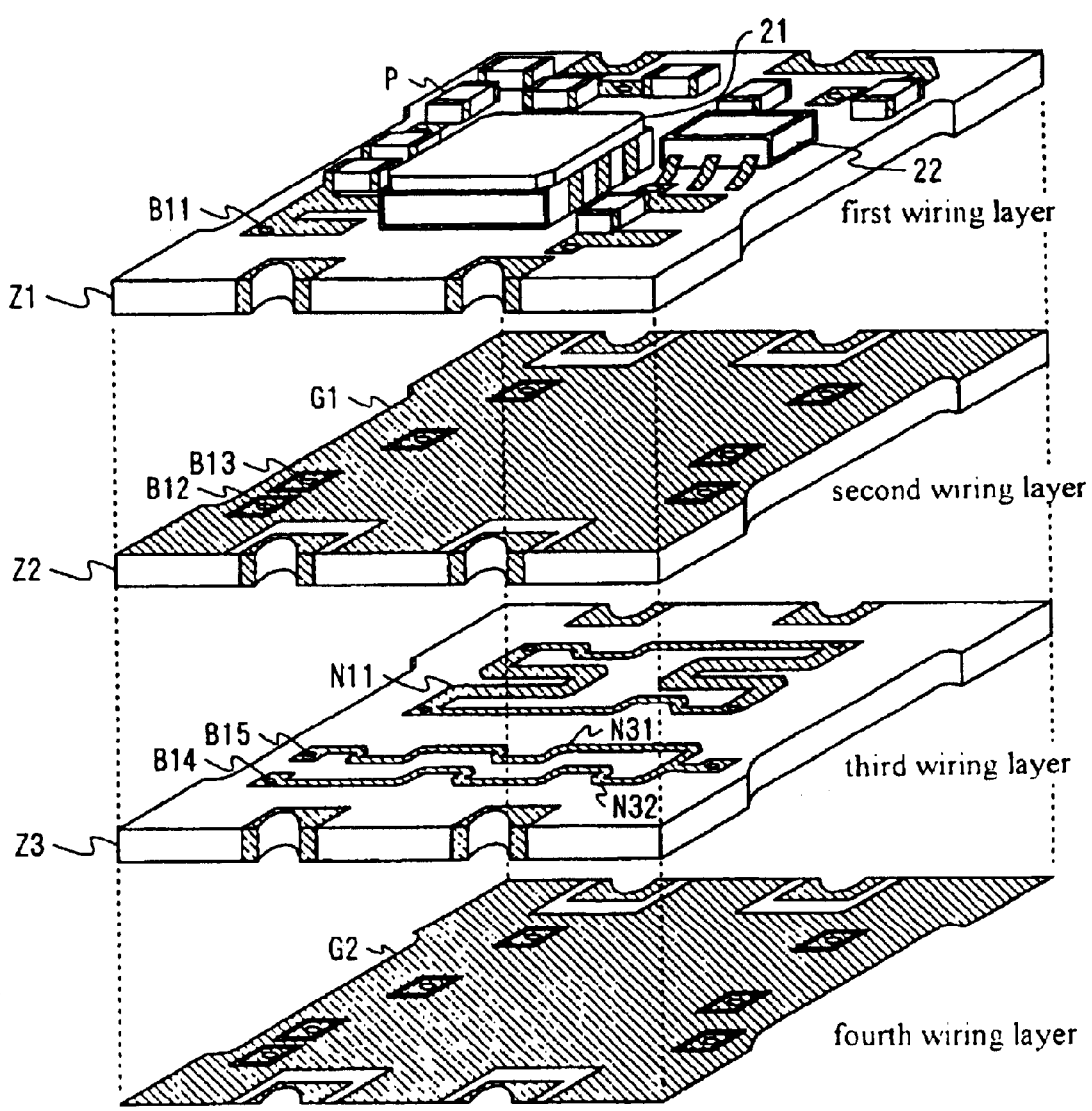
FIG. 7 is a perspective view to show an exemplary structure of the voltage controlled oscillation in FIG. 6.

FIG. 7 is a perspective view to show an exemplary structure of the voltage controlled oscillation in FIG. 6. In FIG. 7, the voltage controlled oscillator in FIG. 5 is mounted on a four-layer wiring board. The four-layer wiring board includes a first wiring layer H1, a second wiring layer H2, a third wiring layer H3, and a fourth wiring layer H4 as well as insulating layers Z1–Z3 in-between. The insulating layers Z1–Z3 are provided with via holes B11–B15 for connecting the wiring layers H1–H4 as required.

Here, the second wiring layer H2 is used as a ground layer GI and the fourth wiring layer H4 is provided with a ground layer G2. The first and second wiring layers H1 and H2 form a microstrip line structure. The second, third, and fourth wiring layers H2, H3, and H4 form a strip line structure. Thus, the surface acoustic element 21 and amplifier 22 are mounted on the first wiring layer H1 having the microstrip line structure and so is a chip element including the capacitors C35–C38, coils L35, L36, resistors R31, R32, and variable capacitors A31, A32.

The third wiring layer H3 having the strip line structure, the line N11 of the −3 dB90° hybrid coupler 23a in FIG. 5 is formed and so are the lines N31, N32 of the equal power divider 25. For the voltage controlled oscillator in the form of a distributed constant circuit, the arrangement in which the line N11 of the −3 dB90° hybrid coupler 23a and the lines N31, N32 of the equal power divider 25, which occupy a large area, are formed by the third wiring layer H3. The surface acoustic element 21, amplifier 22, and chip element P, which cannot be built in the board, are formed on the first wiring layer H1, preventing the horizontal extension of the lines N11, N31, and N32 on the first wiring layer H1, and leading to the downsizing of the voltage controlled oscillator.

Figure 8:
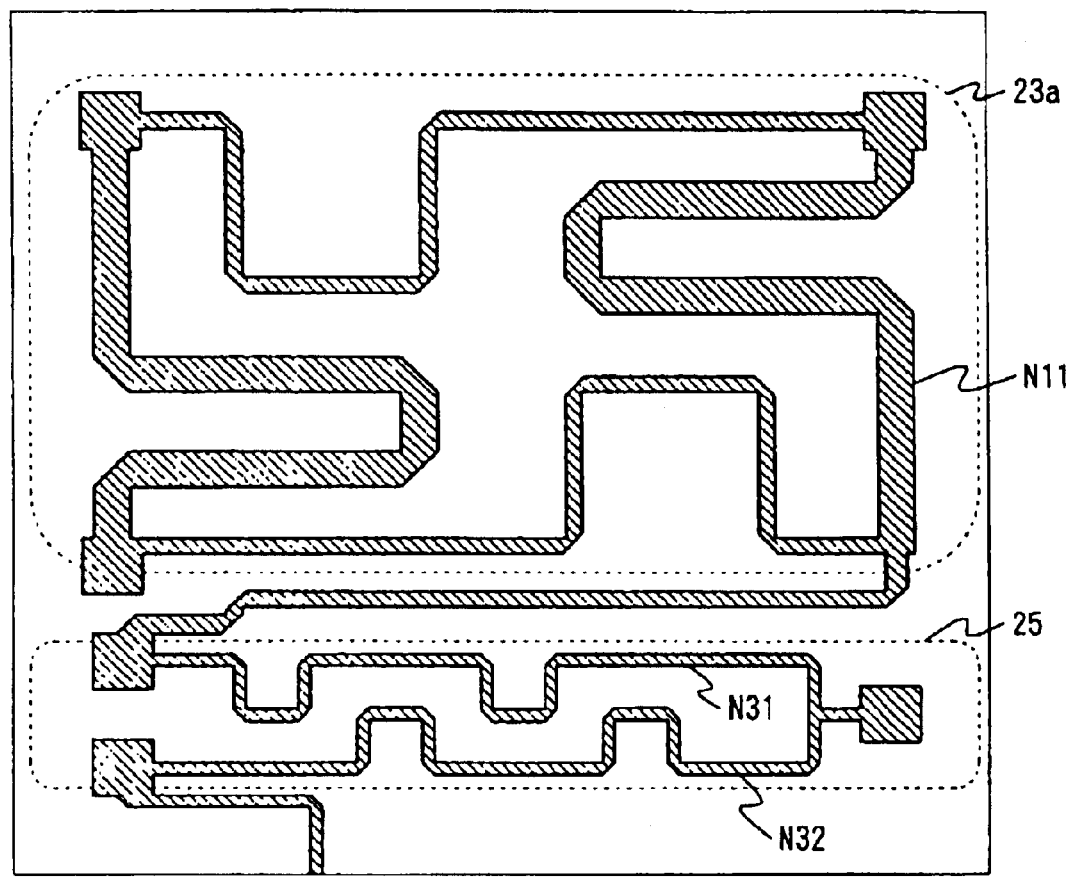
FIG. 8 is a top view to show the detailed structure of the third conductive layer in FIG. 7.

FIG. 8 is a top view to show the detailed structure of the third conductive layer in FIG. 7.

In FIG. 8, the line N11 of the −3 dB90° hybrid coupler 23a and the lines N31, N32 of the equal power divider 25 in FIG. 5 are formed on the third wiring layer H3 having a strip line structure.

Here, the lines N11, N31, and N32, which are required to have certain lengths and sizes to obtain the desired properties of the voltage controlled oscillator, are bent in a manner that the convex and concave parts engage each other on a plane of the third wiring layer.

The lines N11, N31, and N32 can be formed by etching copper film deposited on the insulating layer Z3. The copper film pattern on the insulating layer Z3 can be modified so that the third wiring layer H3 has a smaller area as a result of the lines N11, N31, and N32 being bent.

The size of the voltage controlled oscillator primarily depends on the area of the third wiring layer H3. Therefore, giving the third wiring layer H3 a smaller area, the entire voltage controlled oscillator will be smaller. With the lines N11, N31, and N32 being bent in a pattern that causes no interference with one another, the voltage controlled oscillator can be further downsized.

Figure 9A:
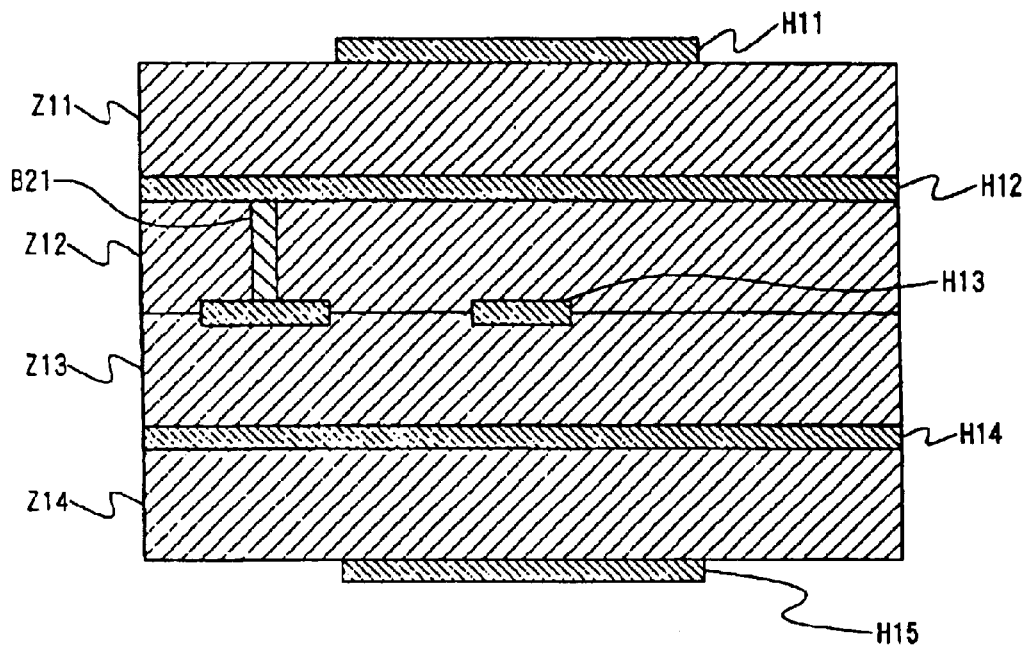
FIG. 9(a) is a section view to schematically show the structure of the voltage controlled oscillator of Embodiment 5 of the present invention.

The bending and pattern of rectangular convex and concave bends of the lines N11, N31, and N32 are described with the strip line structure above. However, it is applicable to the microstrip line structure. FIG. 9(a) is a section view to schematically show the structure of the voltage controlled oscillator of Embodiment 5 of the present invention. Embodiment 5 adds an underlying fifth wiring layer to the four-layer wiring board in FIG. 6 to give an additional microstrip line structure.

In FIG. 9(a), the five-layer wiring board includes a first wiring layer H11, a second wiring layer H12, a third wiring layer H13, a fourth wiring layer H14, and a fifth wiring layer H15 as well as insulating layers Z11–Z14 in-between. The wiring layers H11–H15 are connected by way of a via B21 as required. The second and fourth wiring layers H12 and H14 have a ground layer. The first and second wiring layers H11 and H12 form a microstrip line structure. The second, third, and fourth wiring layers H12, H13, and H14 form a strip line structure. The fourth and fifth wiring layers H14 and H15 form a microstrip line structure.

Embodiment 5 described above has the fifth wiring layer H15 underlying the fourth wiring layer H4. This allows the third and fifth wiring layers H13 and H15 to share the ground layer formed by the fourth wiring layer H14. This one additional wiring layer enables the addition of a microstrip line structure.

Figure 9B:
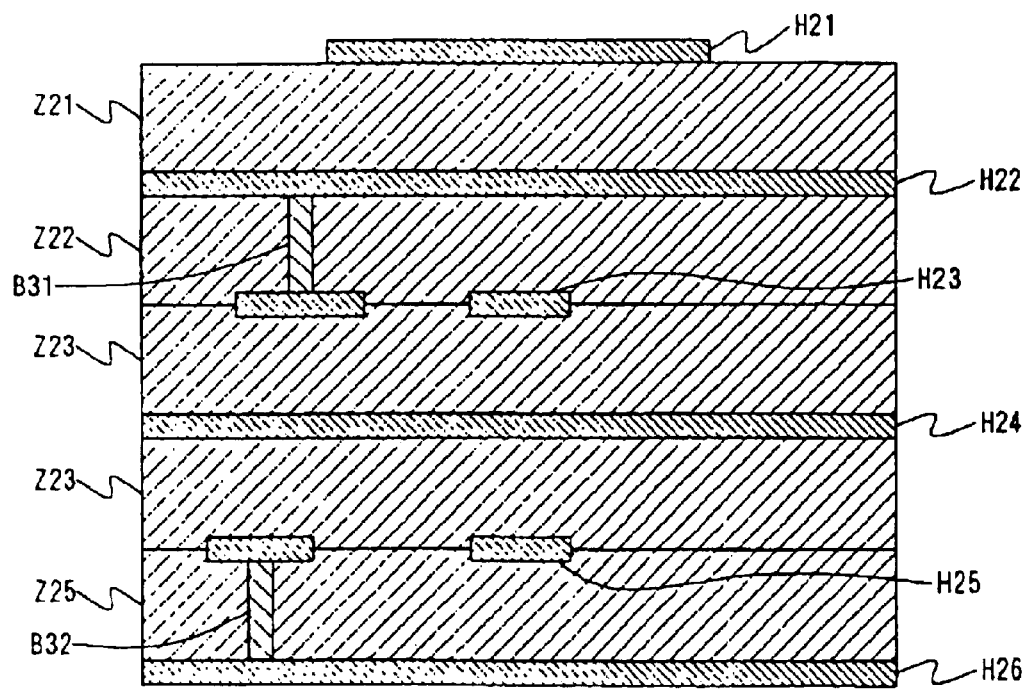
FIG. 9(b) is a section view to schematically show the structure of the voltage controlled oscillator of Embodiment 6 of the present invention.

FIG. 9(b) is a section view to schematically show the structure of the voltage controlled oscillator of Embodiment 6 of the present invention. Embodiment 6 adds underlying fifth and sixth wiring layers to the four-layer board in FIG. 6 to give an additional strip line structure. In FIG. 9(b), the six-layer wiring board includes a first wiring layer H21, a second wiring layer H22, a third wiring layer H23, a fourth wiring layer H24, a fifth wiring layer H25, and a sixth wiring layer H26 as well as insulating layers Z21–Z25 in-between. The wiring layers H21–H26 are connected with via holes B31, B32 as required.

The second, fourth, and sixth wiring layers H22, H24 and H26 have a ground layer. The first and second wiring layers H21 and H22 form of a microstrip line structure. The second, third, and fourth wiring layers H22, H23, and H24 form a strip line structure. The fourth, fifth, and sixth wiring layers H24, H25, and H26 form a strip line structure.

In this way, the mounting area can be reduced for relatively large-scale distributed constant circuits, realizing a downsized circuit board. The insulating layers Z11–Z14 and Z21–Z25 used in the multi-layer boards can be made of (dielectric) materials such as glass epoxy resin, Teflon (registered trademark) resin, and alumina ceramics. The multi-layer board can have different dielectric constants in the respective layers.

Figure 10:
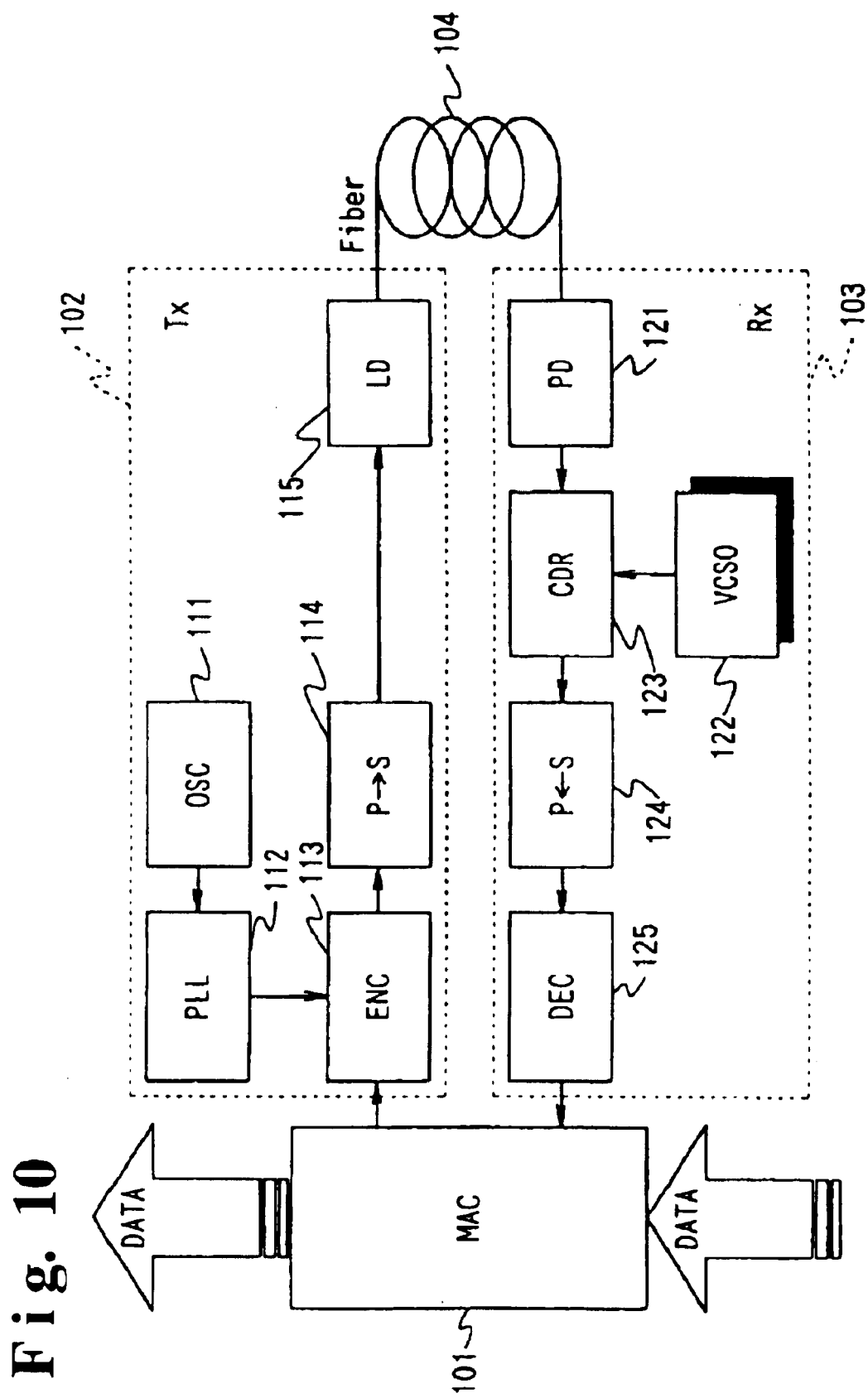
FIG. 10 is a block diagram to show the structure of the communication device of Embodiment 7 of the present invention.
Figure 11:
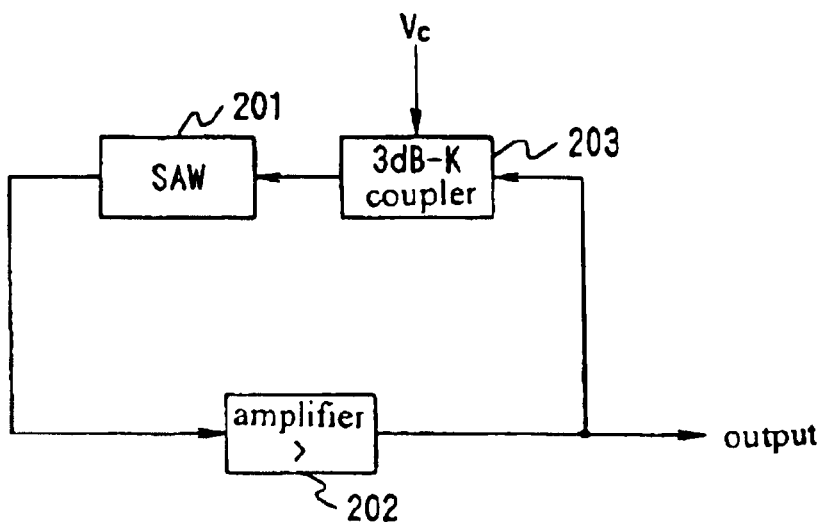
FIG. 11 is a block diagram to show a first exemplary structure of the prior art voltage controlled oscillator.
Figure 12:
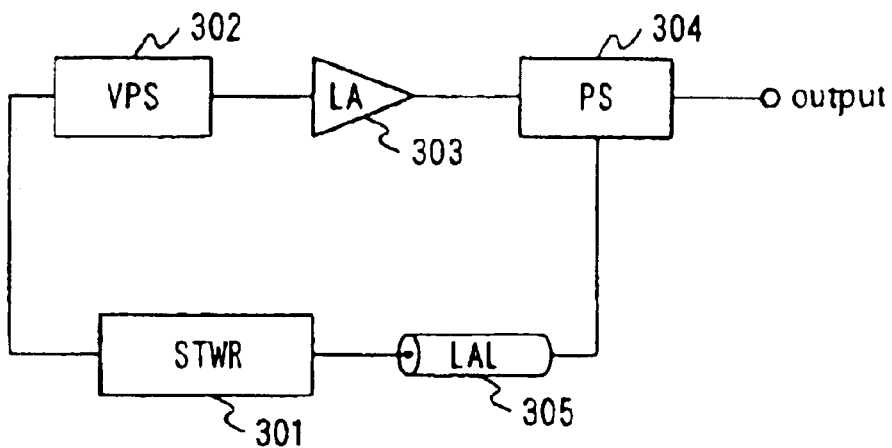
FIG. 12 is a block diagram to show a second exemplary structure of the prior art voltage controlled oscillator.

FIG. 10 is a block diagram to show the structure of the communication device of Embodiment 7 of the present invention. Embodiment 7 is an example of gigabits network systems in which the voltage controlled oscillator in FIG. 1 is used. With increased use of the internet, the gigabits network system deals with motion image data besides voice and still image data.

Motion image data volume is much larger than still image data. It can be several hundred megabytes to several gigabytes. For smooth transfer of this large volume data between computers, the network system connecting computers should be capable of high speed transfer. The network system may have a data transmission rate of several gigabits/second to several tens gigabits/second.

In FIG. 10, a data access control part 101 is connected to a transmission part 102 and a receiver part 103. Optical signals from the transmission part 102 are supplied to the receiver part 103 via an optical fiber 104. The transmission part 102 is provided with an oscillator 111, a PLL control part 112, an encoder 113, a serializer 114, and a laser diode 115.

The receiver part 103 is provided with a photodiode 121, a voltage controlled oscillator 122, a clock data recovery 123, a deserializer 124, and a decoder 125. The data access control part 101 supplies original parallel data to the transmission part 102. Receiving the parallel data, the transmission part 102 uses the encoder 113 to encode and merge them with a synchronous clock generated by the oscillator 111 and PLL control part 112.

The merged parallel data is converted into serial data by the serializer 114. A laser beam from the laser diode 115 is modulated by the serial data. The modulated laser beam is transmitted through the optical fiber 104. The modulated and transmitted light through the optical fiber 104 is supplied to the receiver part 103. Arriving at the receiver part, the modulated light is received by the photodiode 121, which converts it into electric signals.

The electric signals include data and a synchronous clock. The clock data recovery 123 extracts and reproduces the data and synchronous clock. Here, the clock data recovery 123 functions by means of output signals from the voltage controlled oscillator 122. The voltage controlled oscillator 122 can have, for instance, the structure in FIG. 5.

The serial data reproduced by the clock data recovery 123 is converted into parallel data by the deserializer 124. The parallel data from the deserializer 124 is decoded by the decoder 125. The original parallel data reproduced and received is supplied to the data access control part 101.

The voltage control oscillator 122 having the structure in FIG. 5 and multilayered structure is shown in FIG. 7 can be used to downsize the receiver part 103 while satisfying the basic properties of the receiver part 103.

As is described above, the present invention can prevent an increase in the mounting area and allow a larger frequency tuning range of the voltage controlled oscillator. It can provide excellent frequency tuning properties for the control voltage. The present invention realizes a low insertion loss and a low return loss, which leads to a minimized circuit loss and limited output fluctuations, ensuring a stable circuit operation for the load.

The entire disclosure of Japanese Patent Application No. 2001 304137 filed Sep. 28, 2001 is incorporated by reference herein.

What is claimed is:

1. A voltage controlled oscillator comprising:

an amplifier;

a surface acoustic wave element for forming a feedback circuit for the amplifier;

a phase adjustment circuit including a filter and interposed in the feedback circuit;

a phase shifter including a hybrid coupler to which an additional control part is attached for changing a phase value within an oscillation loop with a control voltage supplied from an external source;

an equal power divider for equally distributing output power within the oscillation loop and supplying the output power outside the oscillation loop; and a multi-layer board for mounting the amplifier, surface acoustic wave element, phase adjustment circuit, phase shifter, and equal power divider in at least two separate layers.

2. The voltage controlled oscillator according to claim 1 wherein the multi-layer board further comprises:
   a micro strip line structure including a first wiring layer and a second wiring layer; and
   a strip line structure including the second wiring layer, a third wiring layer, and a fourth wiring layer.

3. The voltage controlled oscillator according to claim 2 wherein the second and fourth wiring layers are ground layers.

4. The voltage controlled oscillator according to claim 2 wherein:
   the amplifier, surface acoustic wave element, additional control part, and phase adjustment circuit are provided on the micro strip line structure; and
   the hybrid coupler and equal power divider are provided on the strip line structure.

5. The voltage controlled oscillator according to claim 4 wherein the hybrid coupler and equal power divider are formed by the strip line structure have a rectangularly bent transmission line.

6. The voltage controlled oscillator according to claim 5 wherein convex rectangular bends of the transmission lines engage concave rectangular bends of the transmission lines.

7. The voltage controlled oscillator according to claim 1 wherein the multi-layer board further comprises:
   a micro strip line structure including a first wiring layer and a second wiring layer;
   a strip line structure including the second wiring layer, a third wiring layer, and a fourth wiring layer; and
   a micro strip line structure including the fourth wiring layer and a fifth wiring layer.

8. The voltage controlled oscillator according to claim 7 wherein the second and fourth wiring layers are ground layers.

9. The voltage controlled oscillator according to claim 1 wherein the multi-layer board is provided with:
   a micro strip line structure including a first wiring layer and a second wiring layer;
   a strip line structure including the second wiring layer, a third wiring layer, and a fourth wiring layer; and
   a strip line structure including the fourth wiring layer, a fifth wiring layer, and a sixth wiring layer.

10. The voltage controlled oscillator according to claim 9 wherein the second, fourth, and sixth wiring layers are ground layers.

11. A receiver comprising:
   a photodiode for converting optical signals into electric signals;
   a clock data recovery member for extracting data and synchronous signals from the electric signals;
   a voltage controlled oscillator for providing signals to operate the clock data recovery;
   a deserializer for converting serial data extracted by the clock data recovery member into parallel data, and
   a decoder for decoding the parallel data, wherein the voltage controlled oscillator includes:
   an amplifier;
   a surface acoustic wave element for forming a feedback circuit for the amplifier;
   a phase adjustment circuit including a filter and interposed in the feedback circuit;
   a phase shifter including a hybrid coupler to which an additional control part is attached for changing a phase value within an oscillation loop with control voltage supplied from an external source;
   an equal power divider for equally distributing output power within the oscillation loop and supplying the output power outside the oscillation loop; and
   a multi-layer board for mounting the amplifier, surface acoustic wave element, phase adjustment circuit, phase shifter, and equal power divider in at least two separate layers.

12. A communication device comprising:
   an access control part for controlling data access;
   an oscillator for generating synchronous clocks;
   a PLL control part for controlling frequencies based on outputs from the oscillator;
   an encoder for combining and encoding parallel data from the access control part and the synchronous clocks;
   a serializer for converting the parallel data combined with the synchronous clocks into serial data;
   a laser diode for converting the serial data into optical signals;
   a photodiode for converting the optical signals into electrical signals;
   a clock data recovery for extracting the data and synchronous signals from the electrical signals;
   a voltage controlled oscillator for providing signals to operate the clock data recovery;
   a deserializer for converting serial data extracted by the clock data recovery into parallel data; and
   a decoder for decoding and supplying the parallel data to the access control part, wherein the voltage controlled oscillator comprises:
   an amplifier;
   a surface acoustic wave element for forming a feedback circuit for the amplifier;
   a phase adjustment circuit including a filter and interposed in the feedback circuit;
   a phase shifter including a hybrid coupler to which an additional control part is attached for changing a phase value within an oscillation loop with control voltage supplied from an external source;
   an equal power divider for equally distributing output power within the oscillation loop and supplying the output power outside the oscillation loop; and
   a multi-layer board for mounting the amplifier, surface acoustic wave element, phase adjustment circuit, phase shifter, and equal power divider in at least two separate layers.

* * * * *

UNITED STATES PATENT AND TRADEMARK OFFICE
CERTIFICATE OF CORRECTION

PATENT NO. : 6,727,767 B2
DATED : April 27, 2004
INVENTOR(S) : Yutaka Takada

It is certified that error appears in the above-identified patent and that said Letters Patent is hereby corrected as shown below:

Title page,
Item [75], Inventors, "c/o Seiko Epson Corporation 3-5, Owa 3-chome, Suwa-shi, Nagano-ken 392-8502 (JP)" should be -- Minami-minowa-mura (JP) --

Column 1,
Line 26, "gigabits/s" should be -- gigabits/seconds --

Column 2,
Line 48, after "embodiment" insert -- of --

Column 5,
Line 37, "oscillation" should be -- oscillator --

Column 6,
Line 1, delete first occurrence of "the"
Line 39, "G•B›1" should be -- G•$\beta$›1 --

Column 7,
Line 26, "-3 dB90□" should be -- -3 dB90º --
Line 34, "14" should be -- L4 --

Column 8,
Line 27, "In" should be -- in --
Line 63, "capacitor 37" should be -- capacitor C37 --
Line 65, "=3 dB90º" should be -- -3 dB90º --

Column 9,
Line 60, "BI" should be -- B1 --

Column 10,
Line 18, "oscillation" should be -- oscillator --
Line 27, "GI" should be -- G1 --

UNITED STATES PATENT AND TRADEMARK OFFICE
CERTIFICATE OF CORRECTION

PATENT NO.    : 6,727,767 B2
DATED         : April 27, 2004
INVENTOR(S)   : Yutaka Takada It is certified that error appears in the above-identified patent and that said Letters Patent is hereby corrected as shown below:

Column 11,
Line 45, delete "of"

Signed and Sealed this

Twelfth Day of July, 2005

JON W. DUDAS
*Director of the United States Patent and Trademark Office*

UNITED STATES PATENT AND TRADEMARK OFFICE
CERTIFICATE OF CORRECTION

| | |
|---|---|
| PATENT NO. | : 6,727,767 B2 |
| APPLICATION NO. | : 10/238988 |
| DATED | : April 27, 2004 |
| INVENTOR(S) | : Yutaka Takada |

It is certified that error appears in the above-identified patent and that said Letters Patent is hereby corrected as shown below:

Title Page: Assignee item (73): Assignee should be -- Seiko Epson Corporation (JP) --

Signed and Sealed this

Thirtieth Day of January, 2007

JON W. DUDAS
*Director of the United States Patent and Trademark Office*